(12) United States Patent
Rice et al.

(10) Patent No.: US 11,087,998 B2
(45) Date of Patent: Aug. 10, 2021

(54) TRANSFER CHAMBERS WITH AN INCREASED NUMBER OF SIDES, SEMICONDUCTOR DEVICE MANUFACTURING PROCESSING TOOLS, AND PROCESSING METHODS

(71) Applicant: Applied Materials, Inc., Santa Clara, CA (US)

(72) Inventors: Michael Robert Rice, Pleasanton, CA (US); Michael Meyers, San Jose, CA (US); John J. Mazzocco, San Jose, CA (US); Dean C. Hruzek, Cedar Park, TX (US); Michael Kuchar, Georgetown, TX (US); Sushant S. Koshti, Sunnyvale, CA (US); Penchala N. Kankanala, San Ramon, CA (US); Eric A. Englhardt, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/359,561

(22) Filed: Mar. 20, 2019

(65) Prior Publication Data
US 2019/0214284 A1    Jul. 11, 2019

Related U.S. Application Data

(62) Division of application No. 15/029,502, filed as application No. PCT/US2014/063708 on Nov. 3, 2014.
(Continued)

(51) Int. Cl.
*H01L 21/67* (2006.01)
*H01L 21/677* (2006.01)

(52) U.S. Cl.
CPC .. *H01L 21/67184* (2013.01); *H01L 21/67167* (2013.01); *H01L 21/67201* (2013.01); *H01L 21/67196* (2013.01); *H01L 21/67742* (2013.01)

(58) Field of Classification Search
CPC ......... H01L 21/67196; H01L 21/67201; H01L 21/67742; H01L 21/67167; H01L 21/67184; H01L 21/67178
See application file for complete search history.

(56) References Cited

U.S. PATENT DOCUMENTS 5,186,718 A * 2/1993 Tepman ............ H01L 21/67167
29/25.01
5,512,320 A   4/1996 Turner et al.
(Continued)

FOREIGN PATENT DOCUMENTS

EP      0800203 A2   10/1997
EP      1102311 A2    5/2001
(Continued)

OTHER PUBLICATIONS

International Search Report and Written Opinion of International Application No. PCT/US2014/063708 dated Feb. 10, 2015.
(Continued)

*Primary Examiner* — James Keenan
(74) *Attorney, Agent, or Firm* — Lowenstein Sandler LLP (57) ABSTRACT

A transfer chamber configured to be used during semiconductor device manufacturing is described. Transfer chamber includes at least one first side of a first width configured to couple to one or more substrate transfer units (e.g., one or more load locks or one or more pass-through units), and at least a second set of sides of a second width that is different than the first width, the second set of sides configured to couple to one or more processing chambers. A total number of sides of the transfer chamber is at least seven. Transfers within the transfer chamber are serviceable by a single robot.
(Continued)

Process tools and methods for processing substrates are described, as are numerous other aspects.

7 Claims, 11 Drawing Sheets

Related U.S. Application Data (60) Provisional application No. 61/899,862, filed on Nov. 4, 2013.

(56) References Cited

U.S. PATENT DOCUMENTS

| | | | |
|---|---|---|---|
| 5,863,170 A * | 1/1999 | Boitnott | H01L 21/6719 204/298.25 |
| 5,951,770 A | 9/1999 | Perlov et al. | |
| 6,190,103 B1 * | 2/2001 | Erez | H01L 21/67201 294/106 |
| 6,287,386 B1 | 9/2001 | Perlov et al. | |
| 6,309,116 B1 | 10/2001 | Mahara | |
| 6,468,353 B1 | 10/2002 | Perlov et al. | |
| 6,575,737 B1 | 6/2003 | Perlov et al. | |
| 6,916,397 B2 | 7/2005 | Pfeiffer et al. | |
| 7,681,521 B2 * | 3/2010 | Nishibayashi | H01L 21/67754 118/66 |
| 7,720,655 B2 | 5/2010 | Rice | |
| 8,734,720 B2 | 5/2014 | Nichols | |
| 8,771,804 B2 | 7/2014 | Dordi | |
| 9,443,749 B2 | 9/2016 | Wakabayashi | |
| 2001/0017192 A1 | 8/2001 | Hwang et al. | |
| 2002/0170672 A1 | 11/2002 | Perlov et al. | |
| 2003/0035709 A1 | 2/2003 | Cox et al. | |
| 2003/0044742 A1 | 3/2003 | Wang et al. | |
| 2003/0073323 A1 * | 4/2003 | Kim | H01L 21/67161 438/710 |
| 2003/0131458 A1 | 7/2003 | Wang | |
| 2004/0166697 A1 | 8/2004 | Wang et al. | |
| 2004/0211665 A1 | 10/2004 | Yoon et al. | |
| 2005/0072716 A1 | 4/2005 | Quiles et al. | |
| 2005/0186063 A1 | 8/2005 | Rice et al. | |
| 2007/0020890 A1 | 1/2007 | Thakur et al. | |
| 2007/0267144 A1 | 11/2007 | Inagawa | |
| 2008/0175694 A1 | 7/2008 | Park | |
| 2008/0206036 A1 | 8/2008 | Smith | |
| 2008/0226429 A1 | 9/2008 | Van der Meulen | |
| 2009/0108544 A1 | 4/2009 | Sico et al. | |
| 2009/0142167 A1 | 6/2009 | Gage et al. | |
| 2009/0259335 A1 | 10/2009 | Ikeda et al. | |
| 2009/0320948 A1 | 12/2009 | Asanuma et al. | |
| 2011/0038692 A1 | 2/2011 | Hofmeister et al. | |
| 2012/0305196 A1 | 12/2012 | Mori et al. | |
| 2013/0039734 A1 | 2/2013 | Englhardt et al. | |
| 2013/0272823 A1 | 10/2013 | Hudgens et al. | |
| 2014/0174354 A1 | 6/2014 | Arai | |
| 2014/0261168 A1 | 9/2014 | Liang | |
| 2014/0262035 A1 | 9/2014 | Merry | |
| 2014/0262036 A1 | 9/2014 | Reuter et al. | |
| 2014/0263165 A1 | 9/2014 | Hongkham et al. | |
| 2014/0273487 A1 | 9/2014 | Deshmukh et al. | |
| 2015/0013771 A1 | 1/2015 | Quiles et al. | |
| 2015/0013910 A1 | 1/2015 | Krupyshev | |
| 2015/0070814 A1 | 3/2015 | Parkhe et al. | |
| 2015/0082625 A1 | 3/2015 | Rice et al. | |
| 2015/0083330 A1 | 3/2015 | Madiwal et al. | |
| 2015/0090341 A1 | 4/2015 | Ng et al. | |
| 2015/0357228 A1 | 12/2015 | Busche et al. | |
| 2016/0007411 A1 | 1/2016 | Busche et al. | |
| 2016/0007412 A1 | 1/2016 | Busche et al. | |
| 2016/0225646 A1 | 8/2016 | Rice et al. | |

FOREIGN PATENT DOCUMENTS

| | | |
|---|---|---|
| JP | H08-321540 A | 12/1996 |
| JP | H1092900 A | 4/1998 |
| JP | H10-135301 A | 5/1998 |
| JP | 2003-115518 A | 4/2003 |
| JP | 2004-235538 A | 8/2004 |
| JP | 2010/074073 | 4/2010 |
| JP | 2010527149 A | 5/2010 |
| JP | 2011-503837 | 1/2011 |
| JP | 2012-186506 | 9/2012 |
| KR | 10-2007-0014277 | 2/2007 |
| WO | WO 02-02445 | 1/2002 |
| WO | WO 2013/120054 | 8/2013 |

OTHER PUBLICATIONS

International Preliminary Report on Patentability of International Application No. PCT/US2014/063708 dated May 19, 2016.
Non Final Office Action of U.S. Appl. No. 15/029,502 dated Oct. 25, 2017.
Taiwan Search Report of Taiwan Application No. 103138073 dated Dec. 7, 2017.
Jan. 25, 2018 Reply to Oct. 25, 2018 Non Final Office Action of U.S. Appl. No. 15/029,502.
Applicant-Initiated Interview Summary of U.S. Appl. No. 15/029,502 dated Jan. 29, 2018.
Chinese Search Report of Chinese Application No. 201480060288.X dated Dec. 18, 2017.
Final Office Action of U.S. Appl. No. 15/029,502 dated Apr. 23, 2018.
Japanese Office Action of Japanese Application No. 2016-552438 dated Apr. 24, 2018.
Taiwan Search Report of Taiwan Application No. 103138073 dated Apr. 25, 2018.
Jun. 23, 2018 Reply to Apr. 23, 2018 Final Office Action of U.S. Appl. No. 15/029,502.
Advisory Action of U.S. Appl. No. 15/029,502 dated Jul. 3, 2018.
Chinese Search Report of Chinese Application No. 201480060288.X dated May 31, 2018.
Restriction Requirement of U.S. Appl. No. 15/029,502 dated Jul. 27, 2018.
Jul. 30, 2018 Reply to Jul. 27, 2018 Restriction Requirement of U.S. Appl. No. 15/029,502.
Non-Final Office Action of U.S. Appl. No. 15/029,502 dated Aug. 16, 2018.
Japanese Office Action of Japanese Application No. 2016-552438 dated Aug. 28, 2018.
Oct. 2, 2018 Reply to Aug. 16, 2018 Non-Final Office Action of U.S. Appl. No. 15/029,502.
Final Office Action of U.S. Appl. No. 15/029,502 dated Dec. 14, 2018.
Taiwan Search Report of Taiwan Application No. 103138073 dated Aug. 17, 2018.
Jan. 29, 2019 Reply to Dec. 14, 2018 Final Office Action of U.S. Appl. No. 15/029,502.
Advisory Action of U.S. Appl. No. 15/029,502 dated Feb. 5, 2019.
Non-Final Office Action of U.S. Appl. No. 15/029,502 dated Mar. 11, 2019.

* cited by examiner

TRANSFER CHAMBERS WITH AN INCREASED NUMBER OF SIDES, SEMICONDUCTOR DEVICE MANUFACTURING PROCESSING TOOLS, AND PROCESSING METHODS

RELATED APPLICATION

This is a divisional application of, and claims priority from, U.S. patent application Ser. No. 15/029,502, filed Apr. 14, 2016, and entitled "TRANSFER CHAMBERS WITH AN INCREASED NUMBER OF SIDES, SEMICONDUCTOR DEVICE MANUFACTURING PROCESSING TOOLS, AND PROCESSING METHODS", which is a national stage application filed under 35 U.S.C. § 371 of PCT Application No. PCT/US2014/063708, filed Nov. 3, 2014, and entitled "TRANSFER CHAMBERS WITH AN INCREASED NUMBER OF SIDES, SEMICONDUCTOR DEVICE MANUFACTURING PROCESSING TOOLS, AND PROCESSING METHODS", which claims priority from U.S. Provisional Patent Application No. 61/899,862 filed Nov. 4, 2013, and entitled "SEMICONDUCTOR DEVICE MANUFACTURING PLATFORM WITH AN INCREASED NUMBER OF SIDES", each of which is hereby incorporated by reference herein in its entirety for all purposes.

FIELD

The present disclosure relates to semiconductor device manufacturing, and more specifically to semiconductor device manufacturing platform configurations.

BACKGROUND

Manufacturing of semiconductor devices involves performing a sequence of procedures with respect to a substrate or "wafer" such as a silicon substrate, a glass plate, and the like. These steps may include polishing, deposition, etching, photolithography, heat treatment, and so forth. Usually a number of different processing steps may be performed in a single processing system or "tool" that includes a plurality of processing chambers. However, it is generally the case that other processes are performed at other processing locations within a fabrication facility, and it is accordingly necessary that substrates be transported within the fabrication facility from one processing location to another. Depending on the type of semiconductor device to be manufactured, there may be a relatively large number of processing steps employed, to be performed at many different processing locations within the fabrication facility.

It is conventional to transport substrates from one processing location to another within substrate carriers such as sealed pods, cassettes, containers, and so forth. It is also conventional to employ automated substrate carrier transport devices, such as automatic guided vehicles, overhead transport systems, substrate carrier handling robots, and the like, to move substrate carriers from location to location within the fabrication facility or to transfer substrate carriers from or to a substrate carrier transport device.

Such transport of substrates typically involves exposing the substrates to room air, or at least to non-vacuum conditions. Either may expose the substrates to an undesirable environment (e.g., oxidizing species) and/or other contaminants.

SUMMARY

In one aspect, a transfer chamber configured for use during semiconductor device manufacturing is provided. The transfer chamber includes at least a first set of sides of a first width configured to couple to one or more substrate transfer units (e.g., one or more load locks and/or pass-through units); and at least a second set of sides of a second width that is greater than the first width, the second sides configured to couple to one or more processing chambers, wherein a total number of sides of the transfer chamber is at least seven and wherein transfers within the transfer chamber are serviceable by a single robot.

In another aspect, a processing tool is provided. The processing tool includes one or more load locks, a plurality of process chambers, and a transfer chamber including at least one first side of a first width configured to couple to the one or more substrate transfer units, and at least a second set of sides of a second width that is different than the first width, the second sides configured to couple to the one or more processing chambers, wherein a total number of sides of the transfer chamber is at least seven and transfers within the transfer chamber are serviceable by a single robot.

In another aspect, a processing tool is provided. The processing tool includes one or more load locks; a pass-through unit; a first transfer chamber coupled between the one or more load locks and the pass-through unit; and a second transfer chamber coupled to the pass-through unit, wherein a total number of sides configured to receive process chambers between the first transfer chamber and the second transfer chamber is at least ten and transfers within each of the first transfer chamber and the second transfer chamber are each serviceable by a single robot.

In another aspect, an interface unit is provided. The interface unit includes an interface body including a front region including multiple interface sides, the front region configured to couple to a transfer chamber, and a rear region configured to couple to a factory interface, and three load locks formed in the interface body.

In a method aspect, a method of semiconductor device manufacturing is provided. The method includes providing a transfer chamber having least one first side of a first width coupled to one or more substrate transfer units, and at least a second set of sides of a second width that is different than the first width, the second set of sides coupled to a plurality of processing chambers, wherein a total number of sides of the transfer chamber is at least seven, and transferring substrates between the one or more substrate transfer units and at least one of the plurality of processing chambers with a single robot in the transfer chamber.

Numerous other aspects are provided in accordance with these and other embodiments of the disclosure. Other features and aspects of embodiments of the present disclosure will become more fully apparent from the following detailed description, the appended claims, and the accompanying drawings.

BRIEF DESCRIPTION OF THE DRAWINGS

The drawings, described below, are for illustrative purposes only and are not necessarily drawn to scale. The drawings are not intended to limit the scope of this disclosure in any way.

DETAILED DESCRIPTION

Reference will now be made in detail to the example embodiments of this disclosure, which are illustrated in the accompanying drawings. Features of the various embodiments described herein may be combined with each other, unless specifically noted otherwise.

In accordance with embodiments of the present disclosure, a semiconductor device manufacturing platform, such as a tool and/or mainframe (referred to herein as a "processing tool" or "tool"), is provided that includes a transfer chamber including an increased number of locations (e.g., facets) for attaching or otherwise coupling processing chambers and substrate transfer units (e.g., one or more load locks and possibly one or more pass-through units). For example, in some embodiments, at least seven, at least eight, or even nine or more attachment locations may be provided in a transfer chamber within a single tool. Providing additional attachment locations increases a number of processing steps that may be performed at a single tool, may increase throughput by allowing for chamber redundancy (e.g., allowing multiple versions of the same processing chambers to be used in parallel) and allows substrates to remain under vacuum conditions during a larger portion of a manufacturing process.

These and other embodiments are described below with reference to FIGS. 1A-6B.

Figure 1A:
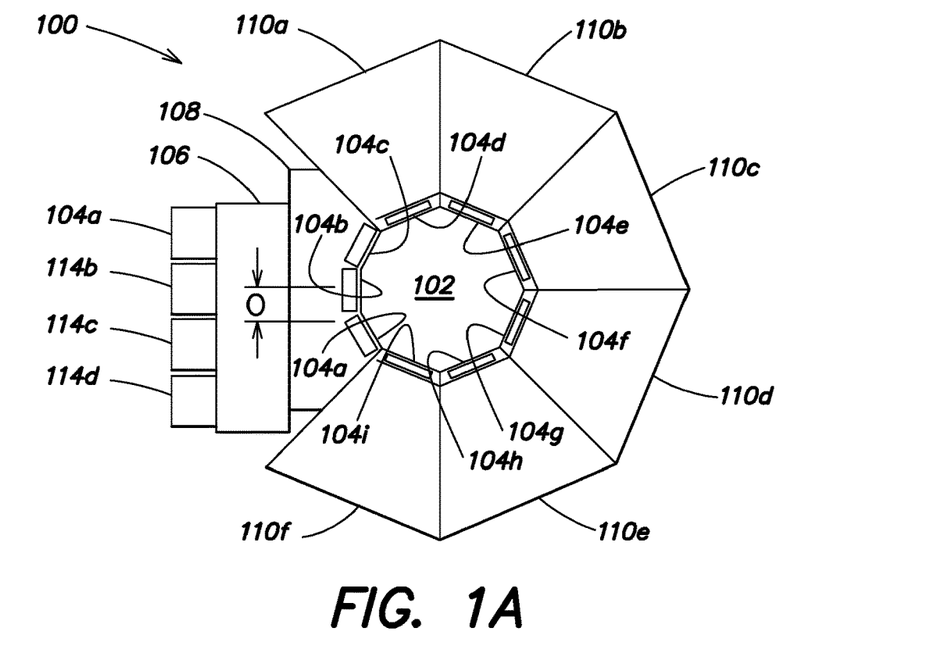
FIGS. 1A-1B illustrates top schematic views of an example processing tool provided in accordance with embodiments.
Figure 1B:
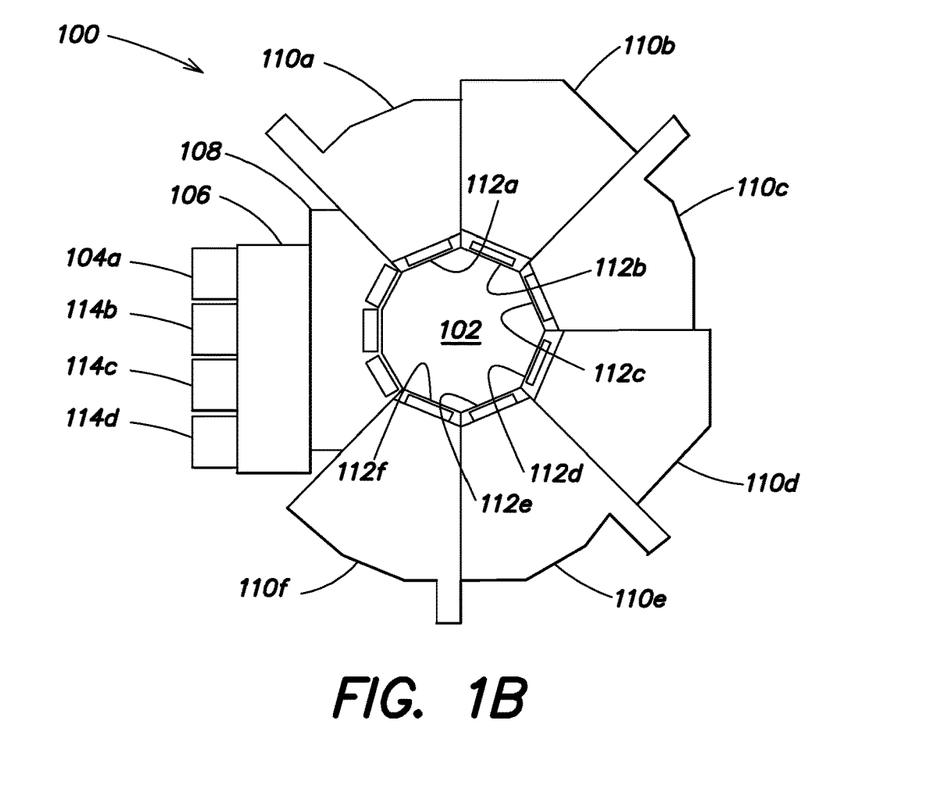

FIGS. 1A-1B illustrate top schematic plan views of an example processing tool 100 provided in accordance with embodiments of the disclosure. With reference to FIG. 1A, the processing tool 100 includes a transfer chamber 102 having a plurality of sides (or facets) 104a-104i forming a transfer chamber 102 having a nonagon shape. Other shapes and/or numbers of sides may be employed (e.g., forming a closed polygon).

In the embodiment of FIGS. 1A-1B, a first set of sides 104a, 104b and 104c are narrower than the remaining second set of sides 104d-104i. First set of sides 104a, 104b and 104c are employed to couple the transfer chamber 102 to one or more substrate transfer units, such as load locks 108 (e.g., one, two, or three load locks, for example) that couple to a factory interface 106. The remaining second set of sides 104d-104di may couple to processing chambers 110a-110f. In some embodiments, the first set of sides 104a, 104b and 104c may each have a width of approximately 450 mm to 550 mm, and/or the second set of sides 104d-104i may each have a width of approximately 650 mm to 950 mm. However, in some embodiments, the first set of sides 104a, 104b, 104c and/or the second set of sides 104d-104i may range from about 450 mm to 950 mm and/or may be the same size. Other widths may be employed for first set of sides 104a-104c and/or second set of sides 104d-104i, as may different widths for different sides.

In the embodiment of FIG. 1A, similar processing chambers are coupled to the second set of sides 104d-104i of transfer chamber 102 (e.g., each processing chamber may occupy a similar footprint). However, in some embodiments, such as the embodiment of FIG. 1B, processing chambers 110a, 110c, 110e and 110f may be similar processing chambers, such as epitaxial deposition chambers, while processing chambers 110b and 110d may be a different type of processing chamber, such as etch chambers. The different type is indicated by the footprint occupied by processing chambers 110a, 110c, 110e and 110f being different than the footprint occupied by processing chambers 110b and 110d. Other configurations, number and/or types of processing chambers may be employed.

As shown in FIG. 1B, processing chambers 110a-110f may be coupled to transfer chamber 102 via chamber interfaces 112a-112f, respectively. Such chamber interfaces 112a-112f may include, for example, pass throughs, slit or gate valves, or the like, not separately shown. In embodiments in which a large processing chamber is coupled to the transfer chamber 102, it may be desirable to provide a deeper chamber interface that allows the large processing chamber to be moved and spaced further from the transfer chamber 102. This may be done to accommodate a larger footprint, to provide better service access, and the like, for example. In the embodiment of FIG. 1B, chamber interfaces 112b and 112d are shown as having a greater depth than chamber interfaces 112a, 112c, 112e and 112f. For example, the chamber interfaces 112b and 112d may have a depth of about 260 mm to about 320 mm, and/or the chamber interfaces 112a, 112c, 112e and 112f may have a depth of about 160 mm to about 260 mm. Thus, different ones of the second sets of sides 104a-10f may have chamber interfaces 112a-112f having different depths. Other depths of the chamber interfaces 112a-112f may be employed.

The factory interface 106 is configured to receive one or more substrate carriers 114a-114d for supplying substrates to the processing chambers 110a-f. While four substrate carriers are shown in FIGS. 1A-1B, it will be understood that the factory interface 106 may receive and/or be configured to receive more or fewer substrate carriers. In the embodiment of FIGS. 1A-1B, the geometrical center of the factory interface 106 is offset laterally by a distance "0" from a geometrical center of the transfer chamber 102 in order to provide additional access to the transfer chamber 102. In other embodiments, however, other or no offset may be provided.

Figure 2A:
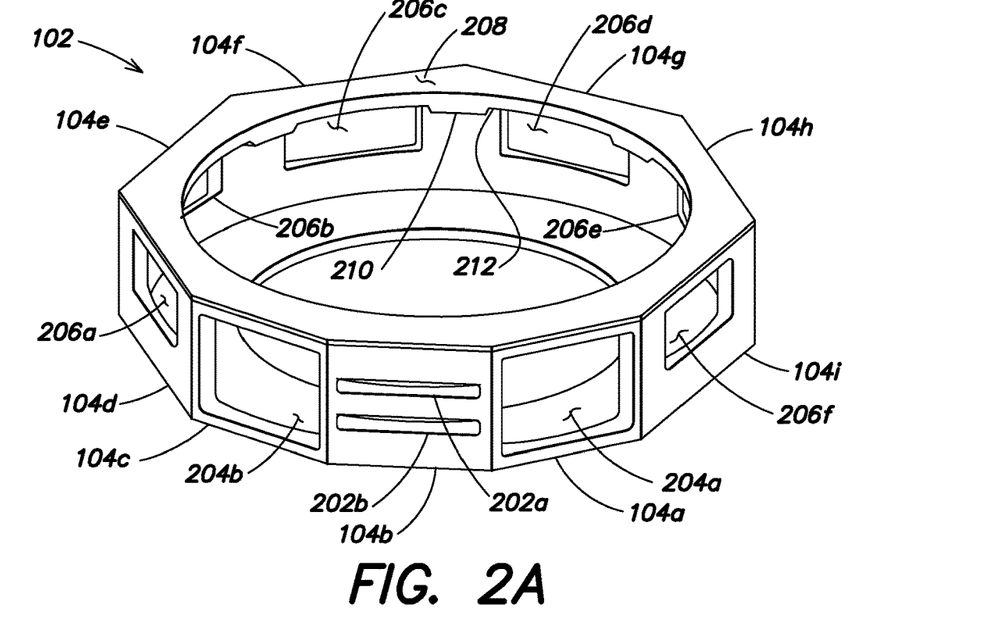
FIGS. 2A-2B illustrates an isometric view and top plan view, respectively, of an example embodiment of the transfer chamber of FIGS. 1A-1B, in accordance with embodiments.
Figure 2B:
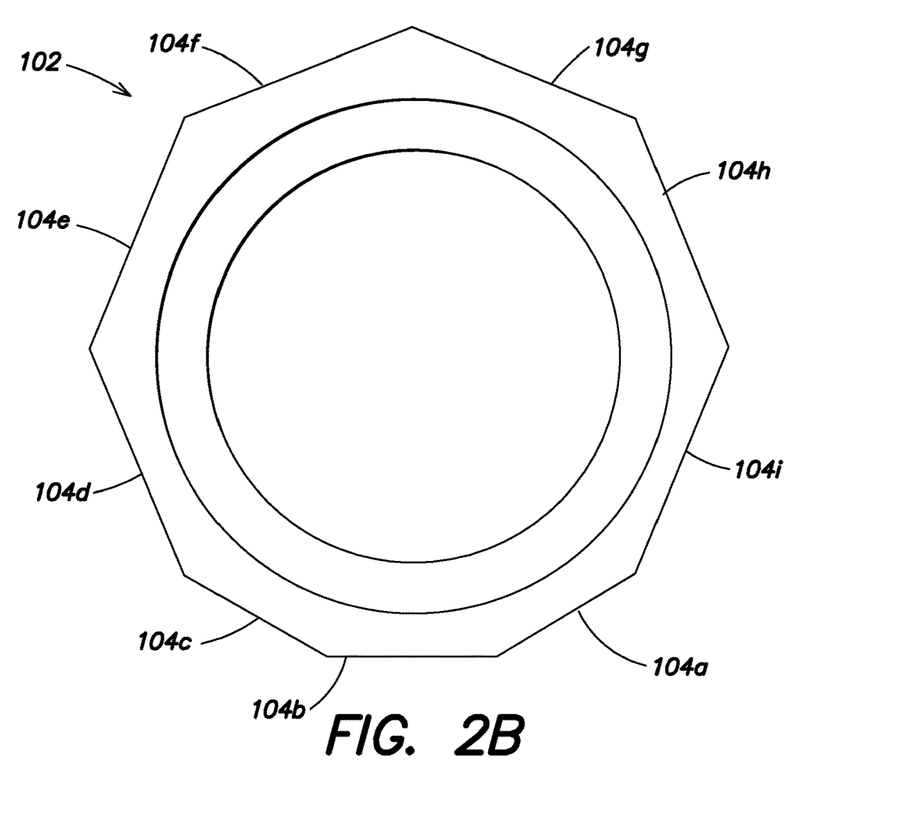

FIGS. 2A-2B illustrates an isometric view and top plan view, respectively, of an example embodiment of the transfer chamber 102, in accordance with embodiments provided herein. With reference to FIGS. 2A-2B, transfer chamber 102 includes slit openings 202a-202b in a first side 104b and openings 204a-204b through the other sides 102a, 104c of the first set of sides for interfacing with up to three substrate transfer units, such as load locks (single, batch or stacked load locks, for example, not separately shown). Slit openings 202a-202b may be sized to allow an end effector to pass from the transfer chamber 102 into a load lock positioned in front of the slit openings 202a-202b. As described further below, openings 204a-204b may be sized larger than the slit openings 202a-202b to allow a wrist or other portion of a robot to extend through the transfer chamber 102 for reaching upper and lower (e.g., stacked) load locks positioned further from the transfer chamber 102. Example dimensions for the slit openings 202a-202b are about 45 mm×400 mm to about 65 mm×600 mm. Example dimensions for the openings 204a-204b are about 280 mm×400 mm to about 430 mm×600 mm. Other dimensions may be used for any of the slit openings 202a-202b and/or openings 204a-204b.

As shown in FIG. 2A, second set of sides 104d-104i include second openings 206a-206f, respectively, which allow a robot to transfer substrates between the transfer chamber 102 and processing chambers (e.g., 110a-110f) that are coupled to the transfer chamber 102. In some embodiments, the second openings 206a-206f may be enlarged to allow a portion of a robot (e.g., a wrist or other portion) to extend through the transfer chamber 102 during such transfers. Example dimensions for the second openings 206a-206f are about 180 mm×400 mm to about 270 mm×600 mm. Other dimensions may be used for the second openings 206a-206f.

In some embodiments, to provide additional strength to the transfer chamber 102, an upper lid 208 of the transfer chamber 102 may be provided with extra material in regions between the second openings 206a-206f. For example, a rib 210 may be provided between each opening 206a-f and/or material may be removed in regions 212 in front of each second opening 206a-206f. For example, each rib 210 may extend about 20-30 mm further into the transfer chamber region than regions 212. Other rib sizes and/or configurations may be employed.

Figure 2C:
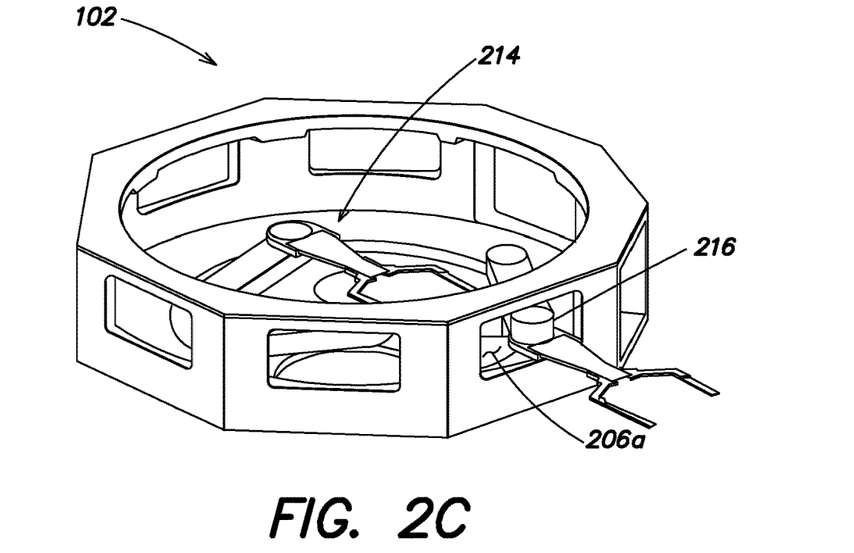
FIGS. 2C-2D illustrates an isometric view and top plan view, respectively, of a transfer chamber of FIGS. 1A-1B having a robot disposed therein, in accordance with embodiments.
Figure 2D:
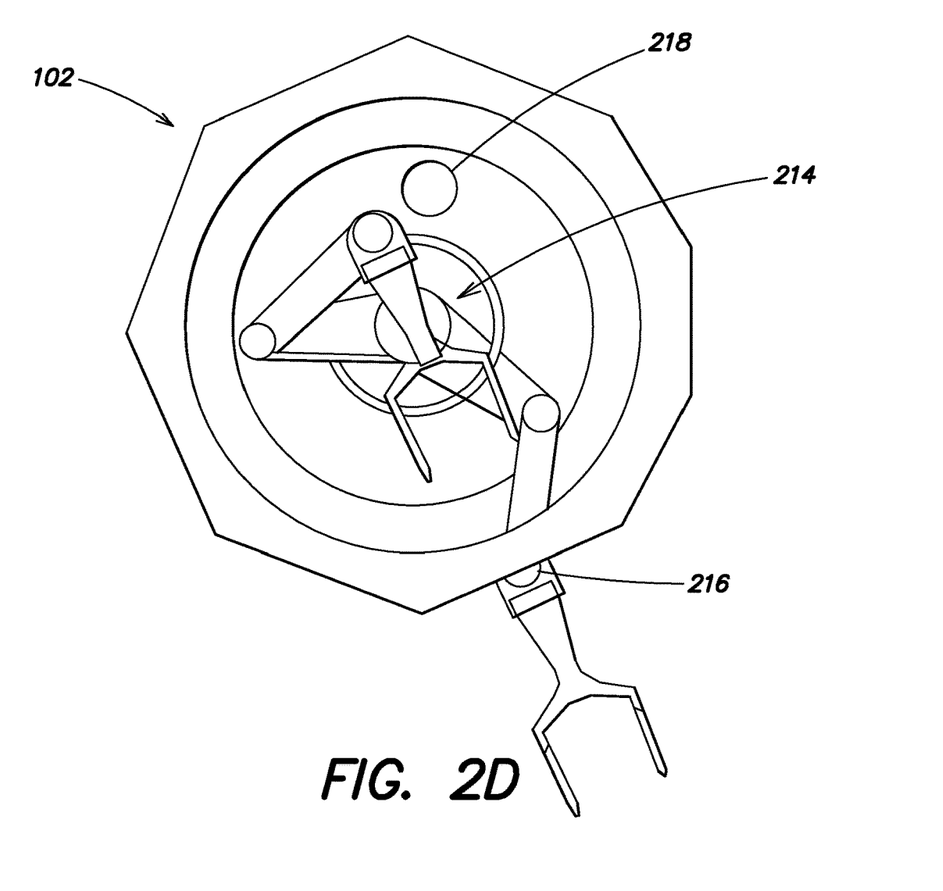

FIGS. 2C-2D illustrates an isometric view and top plan view, respectively, of an example embodiment of the transfer chamber 102 having a robot 214 disposed therein, in accordance with embodiments provided herein. As seen in FIG. 2C, in some embodiments, the second openings 206a-206f may be sized to accommodate a wrist 216 of robot 214 so that robot 214 may extend further through the set of second sides 104d-104i of the transfer chamber 102 during substrate transfer operations. As shown in FIG. 2D, transfer chamber 102 may include one or more pump openings 218 for additional vacuum pumps (e.g., a cryogenic pump or similar device). In some embodiments, the robot 214 may be a dual-arm and/or offset-axis robot. Other robots may be employed.

Figure 3A:
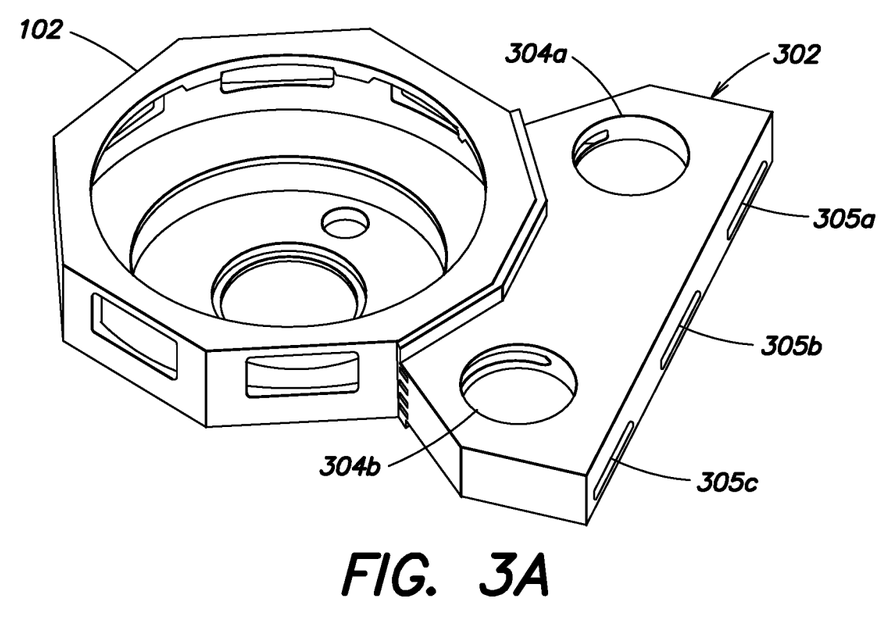
FIGS. 3A-3B illustrates an isometric view and top plan view, respectively, of the transfer chamber of FIGS. 1A-1B having an interface unit coupled to the transfer chamber, in accordance with embodiments.
Figure 3B:
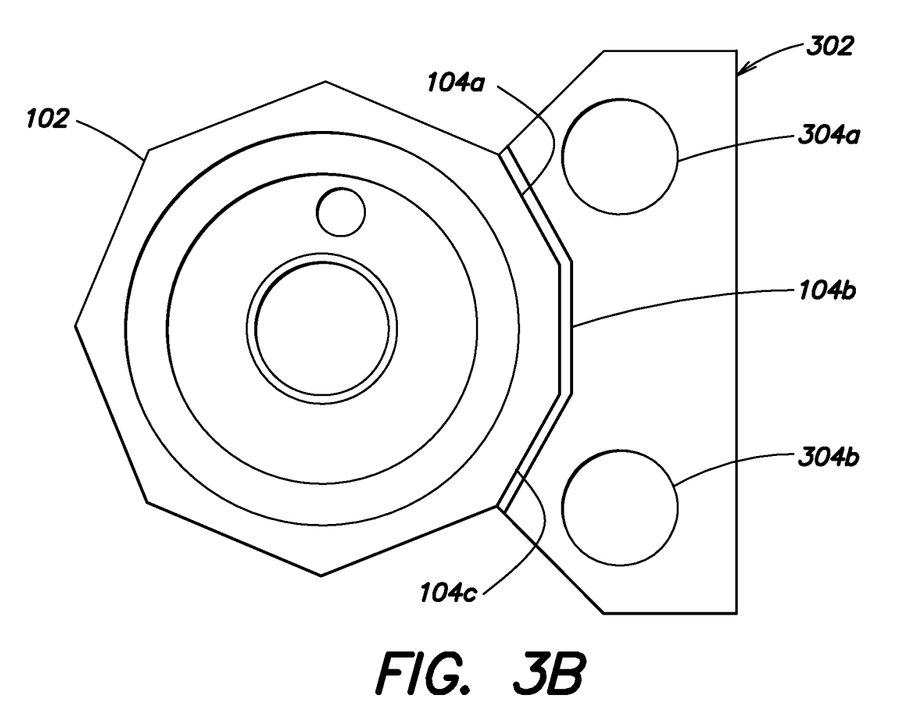

FIGS. 3A-3B illustrates an isometric view and top plan view, respectively, of an example embodiment of the transfer chamber 102 including an interface unit 302 coupled to the transfer chamber 102, in accordance with embodiments provided herein. The interface unit 302 is configured to allow the transfer chamber 102 to interface with up to three load locks (e.g., single or batch load locks, stacked load locks, or the like). All or a portion of the up to three load locks may be formed by the interface unit 302 in some embodiments. Furthermore, in some embodiments, a degas or other processing chamber (not shown) may be positioned above (or within) the interface unit 302, such as above (or within) load lock chambers 304a and/or 304b. Rear openings 305a-305c allow transfer of substrates between factory interface 106 and interface unit 302. Interface unit 302 may be coupled to the first set of sides 104a-104c and to the factory interface 106 by any suitable means such as fasteners (e.g., bolts, screws, or the like).

Figure 3C:
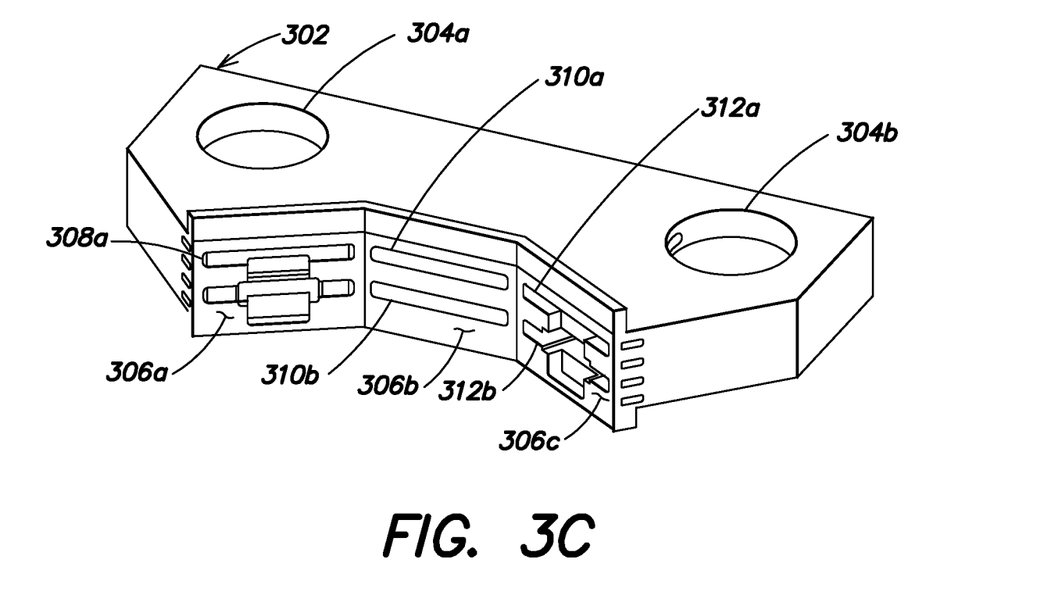
FIGS. 3C-3D illustrates top and bottom isometric views, respectively, of the interface unit of FIGS. 3A-3B, in accordance with embodiments.
Figure 3D:
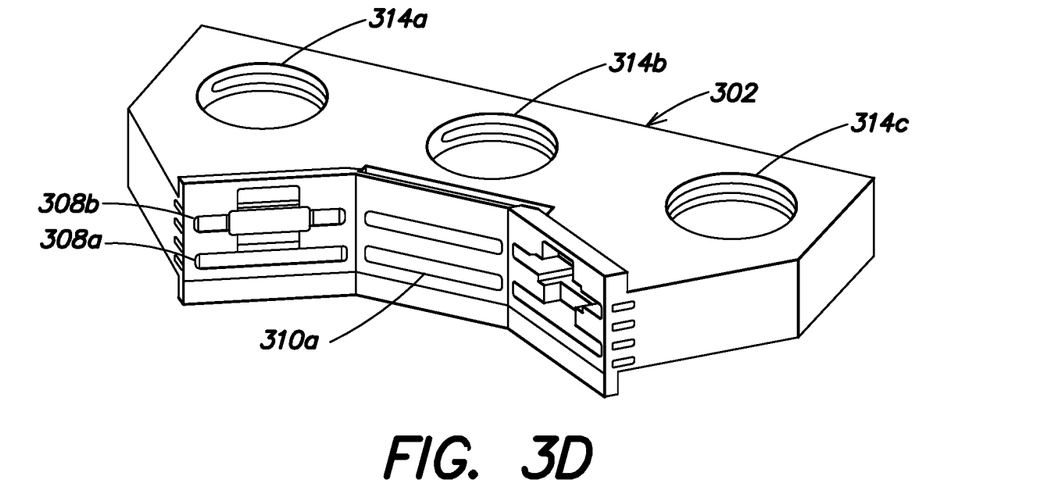

FIGS. 3C-3D are top and bottom isometric views, respectively, of an example embodiment of the interface unit 302, in accordance with embodiments provided herein. A front region of the interface unit 302 includes front interface sides 306a-306c that may couple with first set of sides 104a-104c of transfer chamber 102 (FIG. 1A), respectively. In some embodiments, first front interface side 306a may include first slit openings 308a, 308b, second front interface side 306b may include second slit openings 310a, 310b and third front interface side 306c may include third slit openings 312a, 312b for accommodating substrate transfers between the transfer chamber 102 and load locks (and/or degas/processing chambers) that are part of (or coupled to) the interface unit 302. As shown in FIG. 3D, load lock chambers 314a-314c provide up to three load locks (e.g., single load locks, batch load locks, stacked load locks, etc.) coupled to the transfer chamber 102.

Figure 4A:
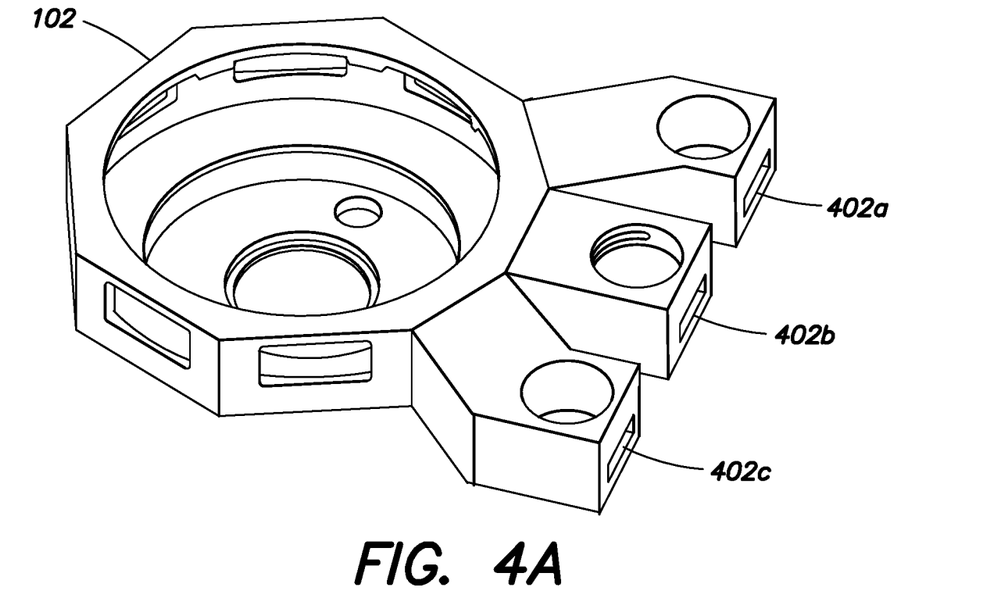
FIGS. 4A-4B illustrates an isometric view and top plan view, respectively, of the transfer chamber of FIGS. 1A-1B having three load lock chambers directly coupled to a first set of sides of the transfer chamber, in accordance with embodiments.
Figure 4B:
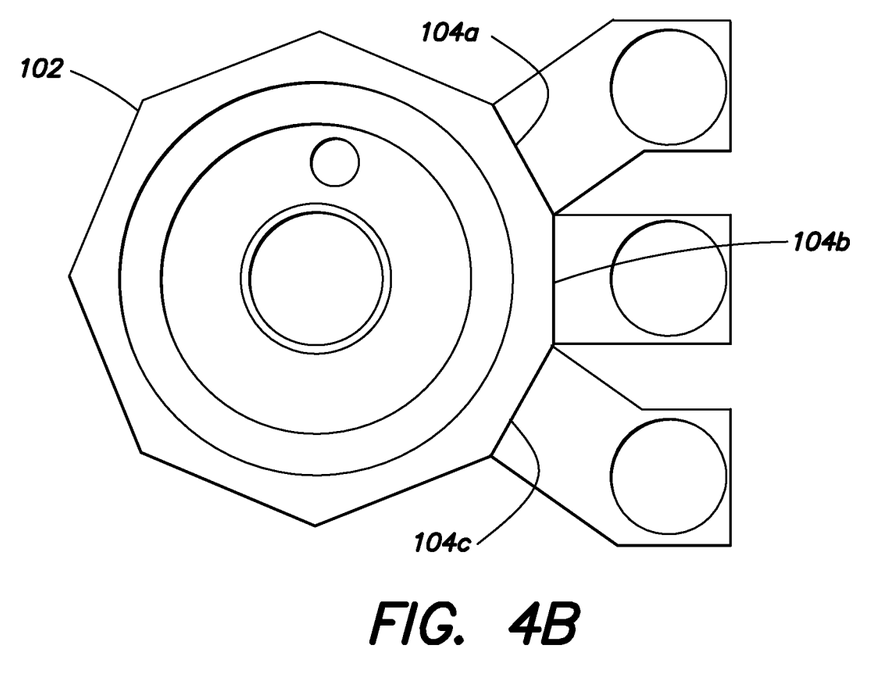

FIGS. 4A-4B illustrates an isometric view and top plan view, respectively, of an example embodiment of the transfer chamber 102 having three load locks 402a, 402b and 402c directly coupled to the set of sides 104a, 104b, and 104c, respectively, the transfer chamber 102, in accordance with embodiments provided herein. The load locks 402a-402c may be single or batch load locks and/or stacked load locks, and/or may include a degas or other processing chamber. Fewer than three load locks may be employed.

Figure 5A:
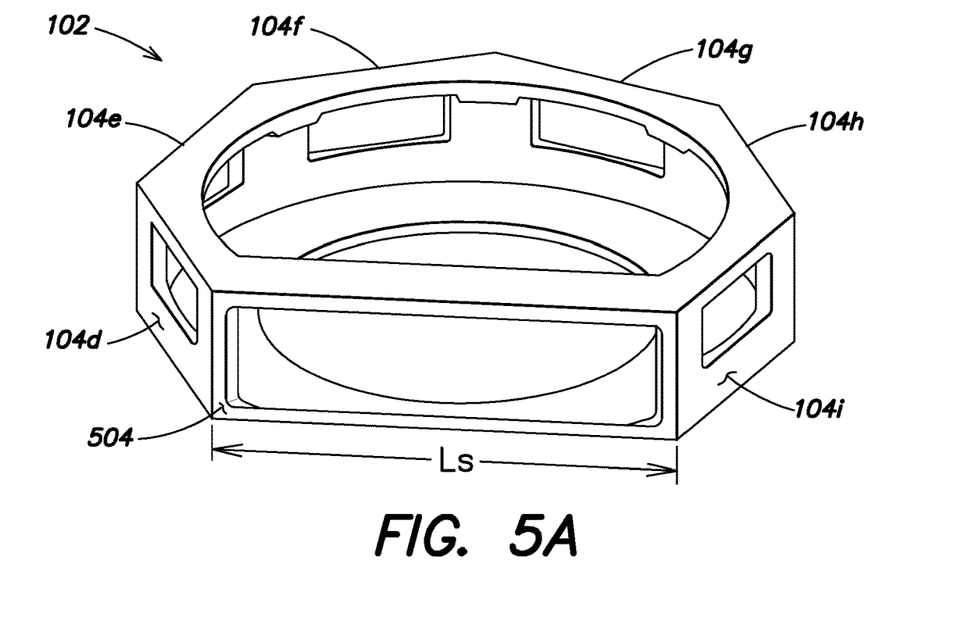
FIGS. 5A-5B illustrates an isometric view and top plan view, respectively, of an alternative transfer chamber, in accordance with embodiments.
Figure 5B:
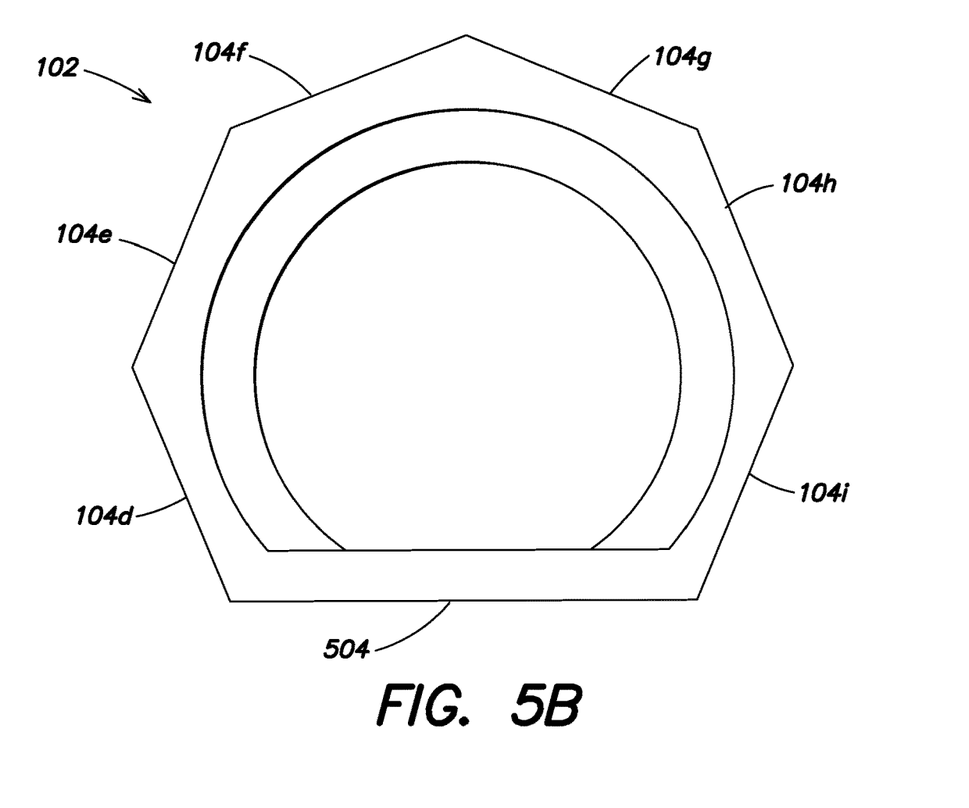

FIGS. 5A-5B illustrates an isometric view and top plan view, respectively, of an alternative embodiment of the transfer chamber 102, in accordance with embodiments provided herein. With reference to FIGS. 5A-5B, the narrower first set of sides 104a, 104b and 104c (FIG. 1A) are replaced with a single side 504 that is relatively longer in width. Single side 504 may have a length Ls that may be longer than a length of any of the second set of sides 104d-104i. Such a design may simply the interface between the transfer chamber 102 and one or more load locks and/or degas/process chambers as described below with reference to FIGS. 5C-5F.

Figure 5C:
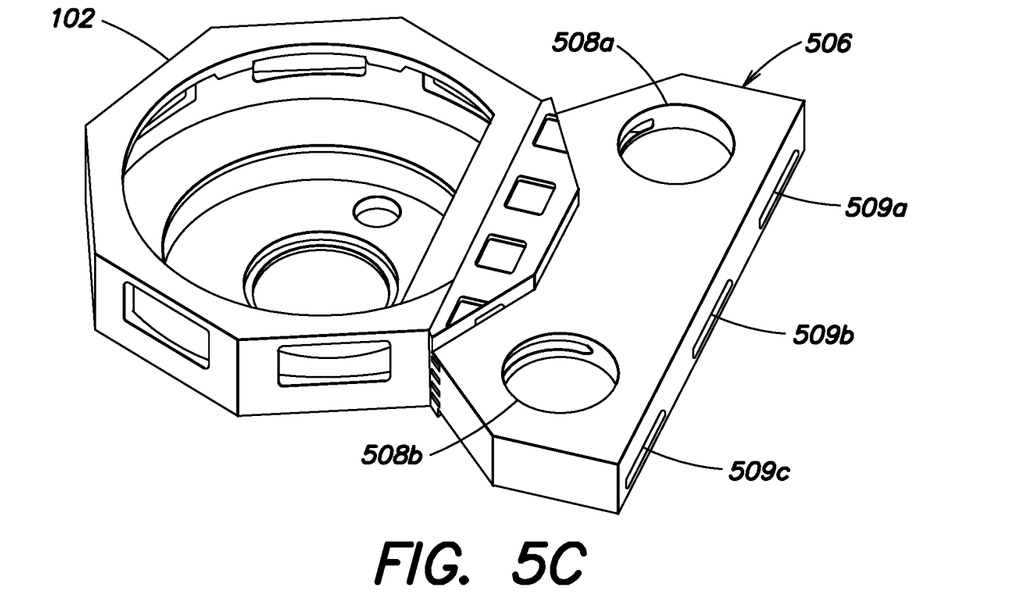
FIGS. 5C-5D illustrates an isometric view and top plan view, respectively, of the transfer chamber of FIGS. 5A-5B having an interface unit coupled to the transfer chamber, in accordance with embodiments.
Figure 5D:
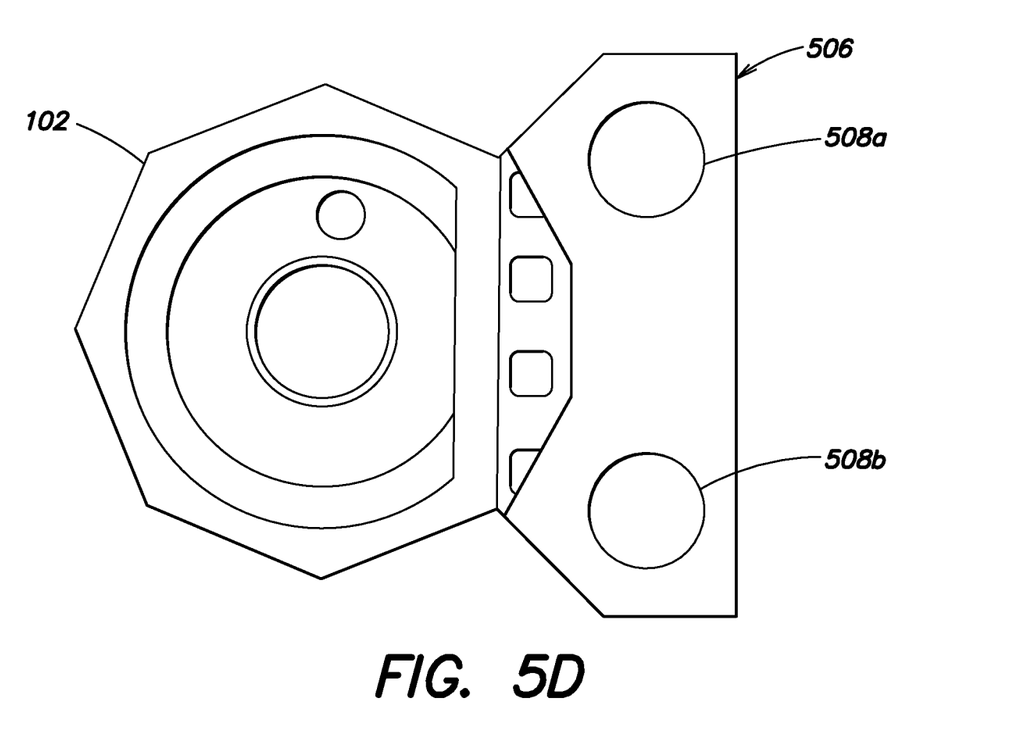

FIGS. 5C-5D illustrates an isometric view and top plan view, respectively, of an example embodiment of the transfer chamber 102 of FIGS. 5A-5B having an interface unit 506 coupled to the transfer chamber 102, in accordance with embodiments provided herein. The interface unit 506 allows the transfer chamber 102 to interface with up to three load locks (e.g., single or batch load locks, stacked load locks, or the like. All or a portion of the up to three load locks may be formed by the interface unit 506 in some embodiments. Further, in some embodiments, a degas or other processing chamber (not shown) may be positioned above or within the interface unit 506, such as above or within interface unit opening 508a and/or interface unit opening 508b. Rear interface openings 509a-509c allow transfer of substrates between factory interface 106 and interface unit 506.

Figure 5E:
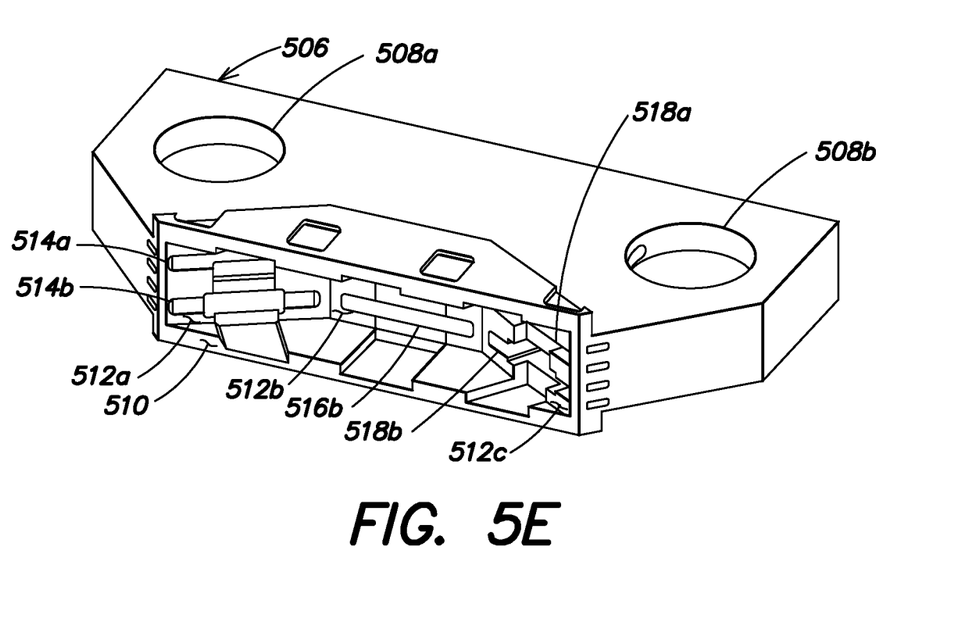
FIGS. 5E-5F illustrates top and bottom isometric views, respectively, of the interface unit of FIGS. 5A-B, in accordance with embodiments.
Figure 5F:
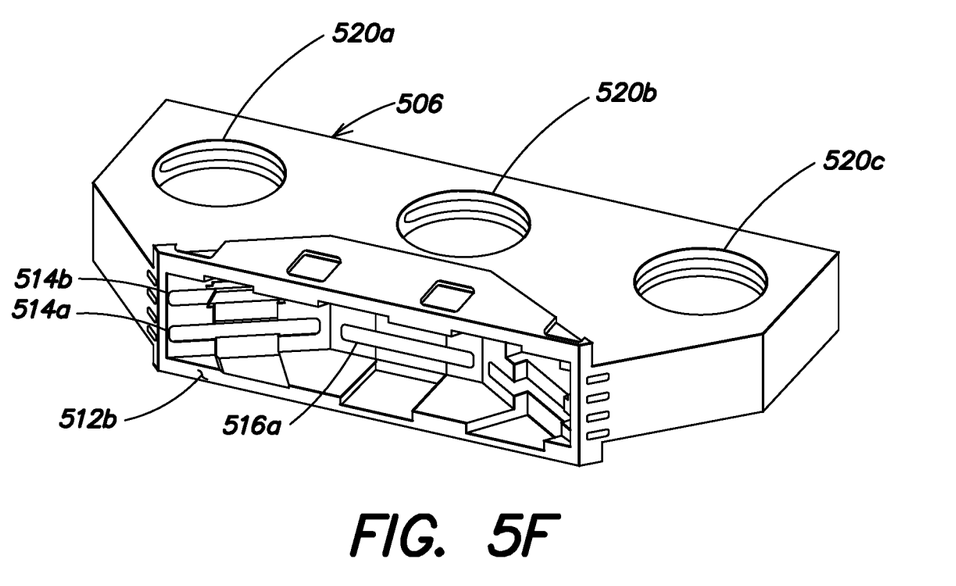

FIGS. 5E-5F are top and bottom isometric views, respectively, of an example embodiment of the interface unit 506, in accordance with embodiments provided herein. A front region 510 of the interface unit 506 may couple with the single side 504 of transfer chamber 102 (FIG. 5A). In some embodiments, multiple interface sides (e.g., interface sides 512a, 512b and 512c) are provided within the interface unit 506; and interface side 512a may include slit openings 514a, 514b, interface side 512b may include slit openings 516a (FIG. 5F), 516b, and interface side 512c may include slit openings 518a, 518b for accommodating substrate transfers between the transfer chamber 102 and load locks (and/or degas/processing chambers) that are part of (or coupled to) the interface unit 506. As shown in FIG. 5F, interface openings 520a-520c provide up to three load locks (e.g., single load locks, batch load locks, stacked load locks, etc.) coupled to the transfer chamber 102. However, other numbers of load locks may be provided, as well as other numbers of interface sides.

Figure 6A:
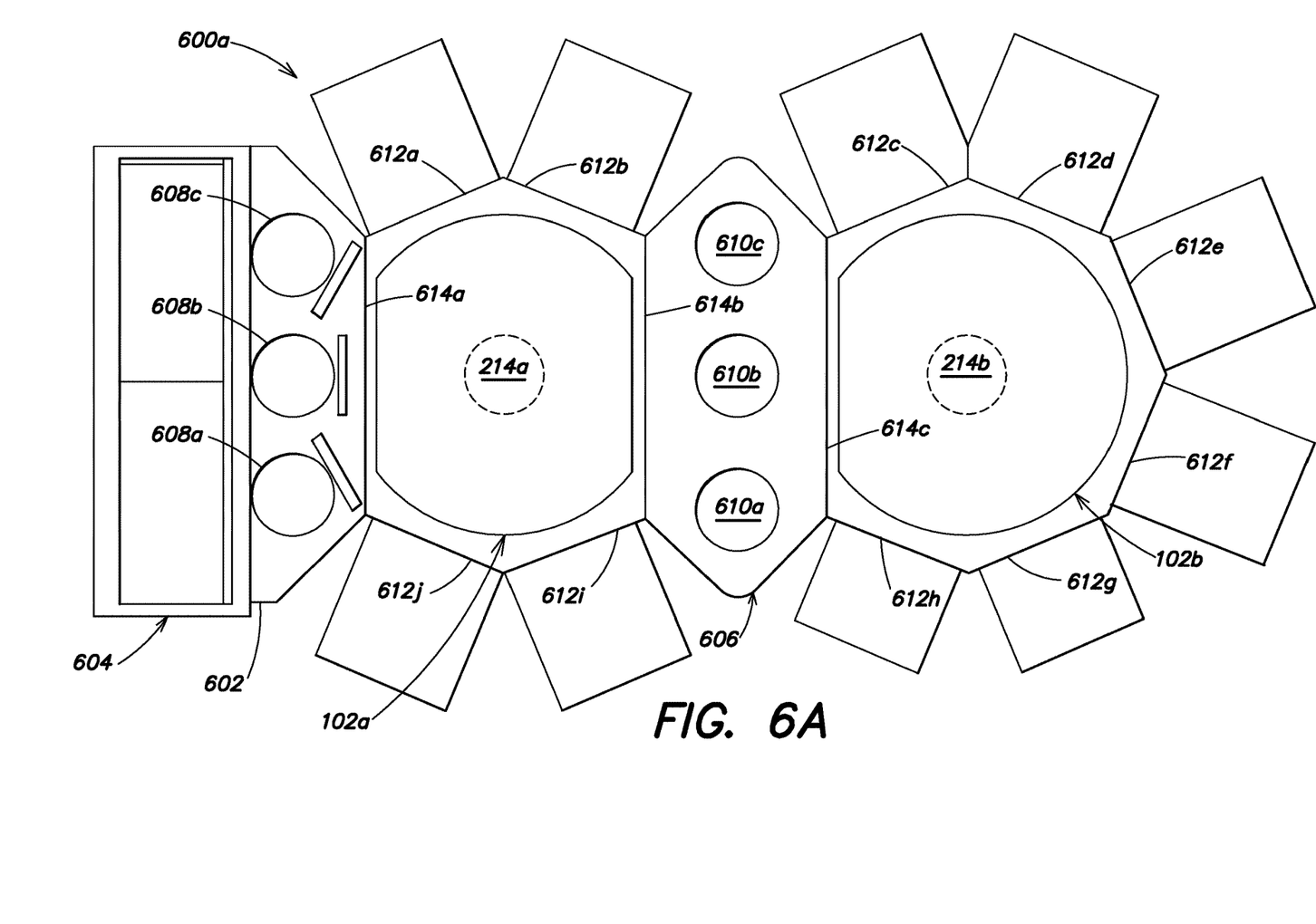
FIG. 6A illustrates a top view of an example processing tool in which two transfer chambers may be coupled together to provide additional sides for processing chambers, in accordance with embodiments.

FIG. 6A illustrates a top view of an example processing tool 600a in which first and second transfer chambers 102a, 102b may be coupled together to provide additional sides for coupling of processing chambers, in accordance with embodiments provided herein. With reference to FIG. 6A, the processing tool 600a includes an interface unit 602 that couples the first transfer chamber 102a to a factory interface 604. A substrate transfer device, such as a pass-through unit 606 couples the second transfer chamber 102b to the first transfer chamber 102a.

In the embodiment of FIG. 6A, the interface unit 602 allows up to three or more substrate transfer devices, such as up to three or more load locks 608a-608c (and/or degas/processing chambers) to supply substrates to the first transfer chamber 102a. Pass-through unit 606 includes three pass-through locations 610a-610c, which may serve as hand-off locations for substrate transfers between the first and second transfer chambers 102a, 102b. In some embodiments, fewer pass-through locations may be employed. Furthermore, in some embodiments, pass-through locations 610a-610c may be capable of performing substrate processing such as degas, annealing, cooling, or the like. Other processes may take place at the pass-through locations 610a-610c.

The processing tool 600a provides up to ten sides (facets) 612a-612j to which processing chambers may be coupled. In other embodiments, additional transfer chambers may be coupled with the addition of other pass-through units to provide any number of linked processing chambers.

In the embodiment of FIG. 6A, first transfer chamber 102a includes first elongated side 614a configured to couple to interface unit 602 and a second elongated side 614b opposite the first elongated side 614a configured to couple to pass-through unit 606. Second transfer chamber 102b includes a single elongated side 614c for coupling to pass-through unit 606. In some embodiments, second transfer chamber 102b may include one or more additional elongated sides configured to couple to additional pass-through units (e.g., when one or more additional transfer chambers are to be employed). In the depicted embodiment, sides 612a, 612b, 612i, 612j may be shorter in length than each of the first elongated side 614a and the second elongated side 614b. Likewise, in the depicted embodiment, the sides 612c-612g may be shorter in length than the single elongated side 614c.

Figure 6B:
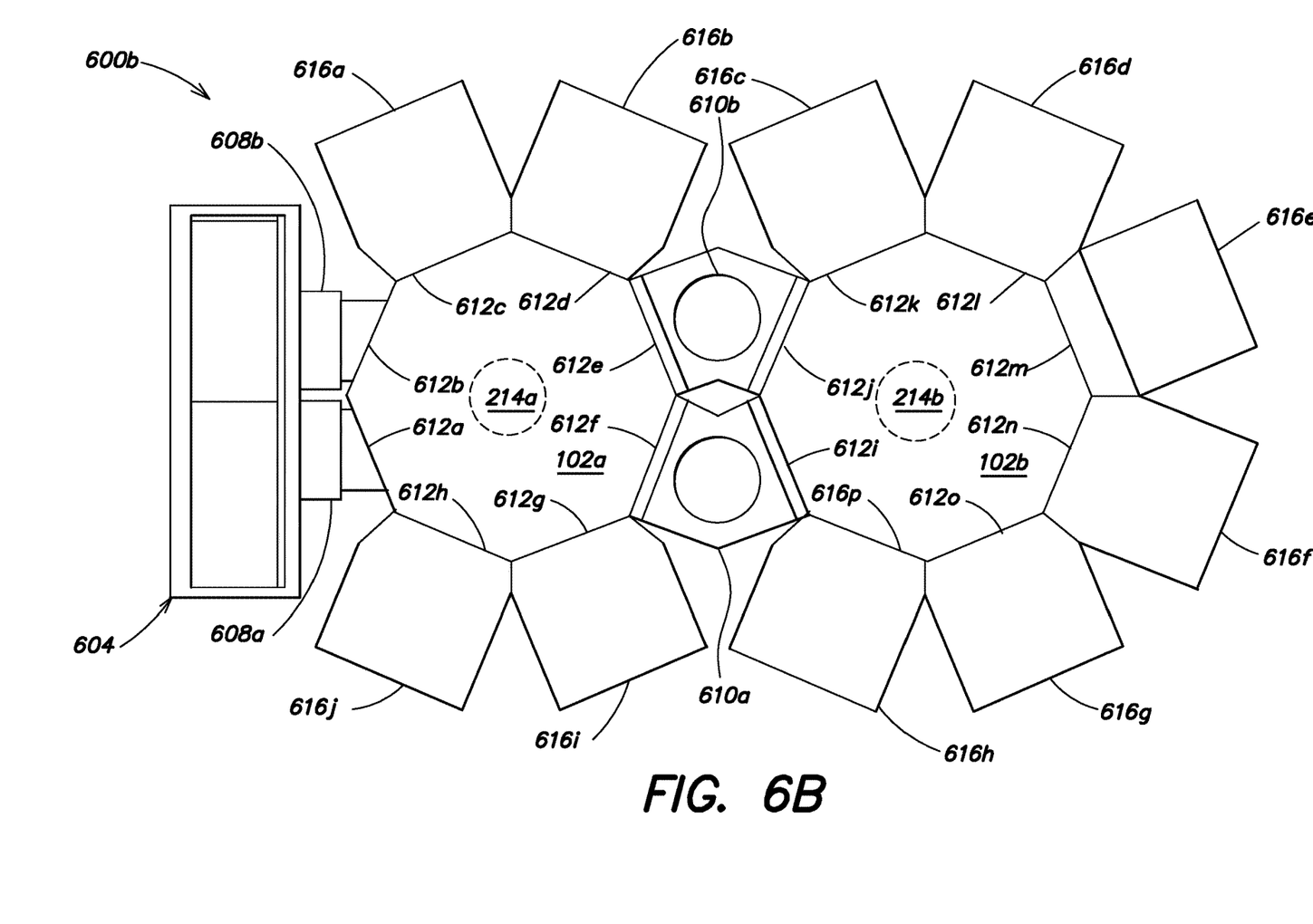
FIG. 6B illustrates a top view of an additional example processing tool in which two transfer chambers are coupled together to provide additional sides for processing chambers, in accordance with embodiments.

FIG. 6B illustrates a top view of another example of a processing tool 600b that is similar to the processing tool 600a of FIG. 6A, but which does not employ elongated sides along either of the first or second transfer chamber 102a, 102b, in accordance with embodiments provided herein. With reference to FIG. 6B, each of the first and second transfer chambers 102a, 102b is illustrated as being octagon shaped (eight-sided), for a total of sixteen sides 612a-612p, which may be of equal length. First transfer chamber 102a is coupled to factory interface 604 via load locks 608a, 608b, and to second transfer chamber 102b via one or more pass-through units 610a, 610b. Processing chambers 616a-616j are shown coupled to sides 612c, 612d, 612h, 612g, 612k, 612l, 612m, 612n, 612o, 612p of the processing tool 600b. In other embodiments, additional transfer chambers may be coupled with additional pass-through units to provide any number of linked processing chambers.

In each of FIGS. 6A and 6B embodiments, the processing tool 600a, 600b includes one or more load locks (e.g., load locks 608a-608c), a pass-through unit (e.g., pass-through unit 606, 610a, 610b), a first transfer chamber (e.g., first transfer chamber 102a) coupled between the one or more load locks (e.g., load locks 608a-608c) and the pass-through unit (e.g., pass-through unit 606, 610a, 610b), and a second transfer chamber (e.g., second transfer chamber 102b) coupled to the pass-through unit (e.g., pass-through unit 606, 610a, 610b). A total number of sides in each process tool 600a, 600b that are configured to receive process chambers between the first transfer chamber 102a and the second transfer chamber 102b, in sum, is at least ten. Transfers within each of the first transfer chamber 102a and the second transfer chamber 102b are each serviceable by a single robot (e.g., robots 214a, 214b-shown as dotted circles).

In another aspect, a method of semiconductor device processing is provided. The method includes providing a transfer chamber (e.g., transfer chamber 102, 102a) having least one first side (e.g., single side 504 or first set of sides 504a-104c) of a first width coupled to one or more substrate transfer units (e.g., one or more load locks or one or more pass-through units 606) and at least a second set of sides of a second width that is different than the first width, the second set of sides coupled to a plurality of processing chambers, wherein a total number of sides of the transfer chamber is at least seven, but may be eight, nine, or more. The method further includes transferring substrates between the one or more substrate transfer units (e.g., load locks or pass-through units 606) and at least one of the plurality of processing chambers (e.g., with a single robot (e.g., robot 214 in the transfer chamber.

While described primarily with reference to seven, eight or nine sides, it will be understood that the transfer chamber 102 may include any suitable number of sides, such as ten sides, eleven sides, twelve sides, or the like. or fewer than seven sides.

The foregoing description discloses only example embodiments of the disclosure. Modifications of the above-disclosed apparatus, systems and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the following claims.

What is claimed is:

1. A processing tool, comprising:
   an interface unit coupled to an interface side, the interface unit comprising one or more load locks and at least one processing chamber;
   a pass-through unit comprising an integral body having three pass-through locations located within the integral body;

a first transfer chamber coupled between the interface side and the pass-through unit, the first transfer chamber comprising:
   at least four first sides to receive processing chambers; and
   a first elongated side, which is elongated compared to the at least four first sides, coupled to the interface side of the interface unit; and
a second transfer chamber coupled to the pass-through unit and comprising:
   at least six second sides to receive processing chambers; and
   a second elongated side, which is elongated compared to the at least six second sides, coupled to the pass-through unit.

2. The processing tool of claim 1, wherein at least one pass-through location of the three pass-through locations is adapted to perform substrate processing.

3. The processing tool of claim 1, wherein the first transfer chamber comprises a third elongated side configured to couple to the pass-through unit and which is elongated compared to the at least four first sides.

4. The processing tool of claim 1, wherein the one or more load locks comprise one or more batch load locks.

5. The processing tool of claim 1, wherein the interface unit comprises rear interface openings that are configured to allow transfer of substrates between a factory interface and the interface unit.

6. The processing tool of claim 1, wherein the interface unit comprises a front region configured to couple with the elongated side of the first transfer chamber.

7. The processing tool of claim 1, further comprising:
   a first single robot to service transfers within the first transfer chamber; and
   a second single robot to service transfers within the second transfer chamber.

* * * * *